METHOD OF MAKING A PRINTED CIRCUIT

Filed Aug. 25, 1955

Howard I. Oshry INVENTORS
Oliver I. Steigerwalt
BY
Ralph Hamman
Attorney 2,912,745

METHOD OF MAKING A PRINTED CIRCUIT

Oliver I. Steigerwalt and Howard I. Oshry, Erie, Pa., assignors to Erie Resistor Corporation, Erie, Pa., a corporation of Pennsylvania Application August 25, 1955, Serial No. 530,584
1 Claim. (Cl. 29—155.5)

This application is an improvement on application Serial No. 315,050, filed October 16, 1952, now Patent No. 2,716,268. As there disclosed, a metal foil is simultaneously united to an underlying deformable plastic base and embossed with a circuit pattern so that unwanted parts of the foil can be removed by a surface abrading operation which leaves the desired circuit pattern at or below the abraded surface. The pattern includes terminal areas which are punched to receive component leads to be connected by soldering.

In the present application, the terminal areas immediately surrounding the parts to be punched are depressed below the level of the remainder of the terminal areas thereby providing at no extra cost a solder receiving cup around the component lead which improves the soldered connection between the lead and the associated terminal area.

Figure 1:
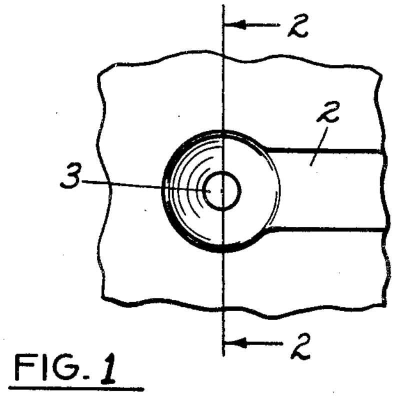
Figure 2:
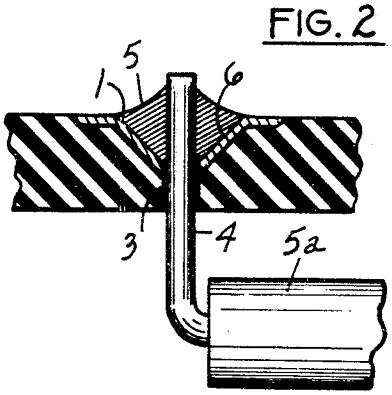
Figure 3:
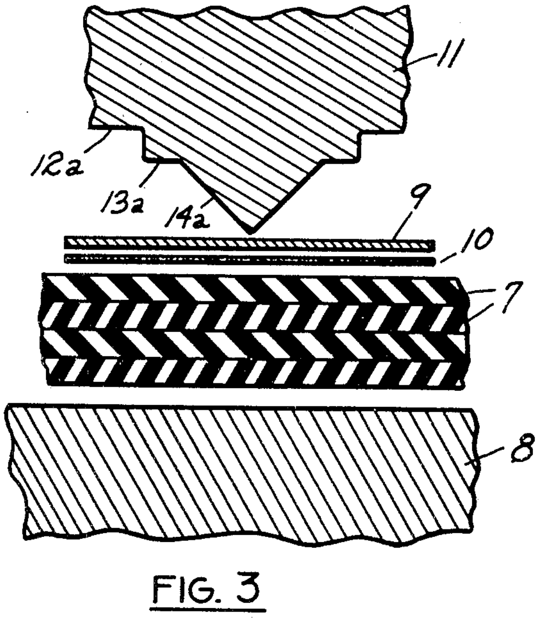
Figure 4:
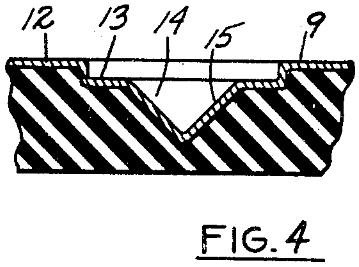

In the drawing, Fig. 1 is a top plan view of a portion of a printed circuit made in accordance with this application; Fig. 2 is a section on line 2—2 of Fig. 1; Fig. 3 is an exploded view illustrating the process of manufacture, and Fig. 4 is a fragmentary section through the printed circuit at the end of the molding operation and prior to the surface abrading operation.

In Fig. 1 is shown a view of a small part of a printed circuit element made in accordance with Patent 2,716,268. The complete printed circuit element will include a great many terminal areas 1 and circuit interconnections 2 arranged to meet the particular circuit requirements. At the center of the terminal area 1 is a punched hole 3 for receiving a lead 4 of an electric circuit component 5*a* such as a resistor or condenser. The electrical connection between the lead 4 and the terminal area 1 is effected by solder 5.

In order to increase the strength of the soldered connection between the lead 4 and the terminal area 1 at the center of the terminal area is a depressed conical cup-shaped portion 6 surrounding the punched hole 3. The cup-shaped portion 6 provides additional bonding area for the solder 5 and which is advantageous for dip soldering where the soldered connections cannot receive individual attention.

In the manufacture of the circuit component, a plurality of sheets 7 of fiber impregnated with uncured plastic are arranged on a heated lower platen 8. On top of the sheets 7 is arranged a sheet 9 of metal foil with an underlying film 10 of adhesive which may be a separate film or may be a coating on the foil or a part of the plastic impregnated sheets 7. The sheets 7 are deformable so that when the upper heated platen 11 closes under molding pressure, the sheets 7 and the foil 9 are consolidated to the finished shape shown in Fig. 4. When the part leaves the molding press the foil 9 is adhesively united to the underlying plastic base which has been molded to the shape determined by the platen 11. If the operations so far described had been carried out with a plain flat surface on both the platens 8 and 11, there would be produced a foil clad plastic laminate such as used in the etched foil type of printed circuit. The plain foil clad laminate would require further processing to determine the type of printed circuit. This further processing is not necessary in the present method where the foil clad laminate is embossed with the desired circuit pattern as a part of the process which is necessary to adhesively join the foil to the laminate.

All parts of the foil 9 are just as firmly united to the underlying molded plastic sheet as though the foil had a plain unembossed surface. Furthermore, the underlying plastic sheet has the same dimensional stability as though it had plain surfaces.

In the molded piece, the sections 12 of the foil which are not wanted in the finished circuit project above the portions 13 which are to remain in the finished circuit at the end of the surface grinding operation which removes all of the portions 12. The surface abrading operation is carried out to a depth below the portions 12 but above the portions 13. The portions 13 comprise the terminal areas 1 and the circuit interconnections 2 of Fig. 1. At the center of the terminal area portions are conical cup-shaped depressions 14 which can easily be punched with the lead receiving holes 3. The side walls 15 of the cup-shaped portions 14 provide the additional solder receiving area desirable for making stronger connections to the leads 4.

In the manufacture of the circuit element, the foil 9, adhesive 10 and plastic impregnated paper 7 are arranged on a platen 8 in the same manner as in the manufacture of plain foil clad laminate. Instead of using a plain platen in contact with the foil 9, there is substituted an embossing platen 11 having areas 12*a*, 13*a*, 14*a*, corresponding to the portions 12, 13 and 14 desired in the finished product. The molding operation is carried out in the same manner as in the molding of plain foil clad laminates and after the completion of the molding operation, the foil surface is subjected to a surface abrading operation to a depth sufficient to remove the unwanted areas 12 but to leave the wanted areas 13. Of course, this surface abrading operation also leaves the cup-shaped depressions 14 surrounding the areas which are to become the terminal areas 1 in the finished product. The punching of the holes 3 to receive the component leads 4 is carried out in the same manner as though there were no cup-shaped depressions at the terminal areas 1.

What is claimed as new is:

The method of making printed electric circuits with terminal areas provided with cup-shaped solder receiving depressions which comprises arranging a metal foil on an uncured deformable base of fibers of insulating material and an impregnating plastic and including adhesive material under the foil, positioning a die on the foil having embossing projections thereon corresponding to the circuit to be printed, and including terminal areas and circuit interconnections, said terminal area forming projections having outstanding therefrom inside the periphery thereof projections for forming cup-shaped depressions spaced inward from the peripheral edges of the terminal areas, pressing the die, foil and base together in a press having platens heated to the flowing temperature of the impregnating plastic under pressure sufficient to emboss the foil under the projections into the underlying surface of the base and maintaining the pressure until the plastic is cured and the foil is united and consolidated with the base, cutting away the foil coated surface of the base to a depth below that of the unembossed portions of the foil to leave only the embossed portions of the foil united with the base with terminal areas on said surface of the base and with foil lined cup shaped depressions projecting therefrom into the base within the terminal areas, and cutting lead receiving holes of diameter smaller than the cup-shaped depressions through the base inside the side walls and at the bottom of the cup-shaped depressions.

References Cited in the file of this patent

UNITED STATES PATENTS

| | | |
|---|---|---|
| 2,345,918 | Dahlstrand | Apr. 4, 1944 |
| 2,502,291 | Taylor | Mar. 28, 1950 |
| 2,683,839 | Beck | July 13, 1954 |
| 2,716,268 | Steigerwalt | Oct. 16, 1955 |